(12) United States Patent
Kim

(10) Patent No.: US 6,388,925 B1
(45) Date of Patent: May 14, 2002

(54) ROW REDUNDANCY SCHEME CAPABLE OF REPLACING DEFECTIVE WORDLINES IN ONE BLOCK WITH REDUNDANT WORDLINES IN ANOTHER BLOCK

(75) Inventor: Gyu-hong Kim, Seoul (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/705,445

(22) Filed: Nov. 2, 2000

(30) Foreign Application Priority Data

Nov. 5, 1999 (KR) .......................................... 1999-48894

(51) Int. Cl.[7] .............................................. G11C 7/00
(52) U.S. Cl. .................................. 365/200; 365/230.03
(58) Field of Search ........................... 365/200, 230.03, 365/189.11, 203, 230.06

(56) References Cited

U.S. PATENT DOCUMENTS

| | | | |
|---|---|---|---|
| 5,325,334 A | | 6/1994 | Roh et al. ..................... 365/201 |
| 5,485,424 A | * | 1/1996 | Kawamura ................... 365/200 |
| 5,841,709 A | * | 11/1998 | McClure ....................... 365/200 |
| 5,978,291 A | * | 11/1999 | Kirihata ........................ 365/200 |
| 6,084,807 A | * | 7/2000 | Choi ............................. 365/200 |
| 6,137,735 A | * | 10/2000 | Wei et al. ..................... 365/200 |

FOREIGN PATENT DOCUMENTS

JP 793991 7/1996

* cited by examiner

Primary Examiner—David Nelms
Assistant Examiner—Thong Le
(74) Attorney, Agent, or Firm—Skjerven Morrill MacPherson LLP; David W. Heid

(57) ABSTRACT

A semiconductor device includes a plurality of memory blocks with each memory block including a normal memory section and a redundant memory section. Redundancy circuits replace some defective wordlines in a normal memory section included in a memory block with redundant wordlines in a redundant memory section included in the memory block and replace any remaining defective wordlines with redundant wordlines in a redundant memory section included in another memory block. Therefore, in the semiconductor device, it is possible to repair defective wordlines even if the number of defective wordlines in a normal memory section is larger than the number of redundant wordlines in the corresponding redundant memory section.

10 Claims, 3 Drawing Sheets

ROW REDUNDANCY SCHEME CAPABLE OF REPLACING DEFECTIVE WORDLINES IN ONE BLOCK WITH REDUNDANT WORDLINES IN ANOTHER BLOCK

BACKGROUND OF THE INVENTION

In general, integrated circuit memory and merged memory with logic (MML) (sometimes referred to herein as semiconductor memory devices) include redundancy circuits for replacing defective memory cells. In general, redundancy circuits include redundant memory cells, which replace defective memory cells, and a redundant selection circuit for selecting the redundant memory cell. The redundant selection circuit typically includes fuses, which a laser can cut, and generates a redundancy signal for accessing the redundant memory cells in response to input of an address of a defective memory cell.

FIG. 1 is a block diagram of a semiconductor memory device employing a conventional row redundancy scheme. In FIG. 1, the semiconductor memory device includes: memory blocks 11a and 11b including sections 11a1 and 11b1 containing normal memory cells and sections 11a2 and 11b2 containing redundant memory cells: row decoders 12a and 12b for respective memory blocks 11a and 11b; redundant selection circuits 13a and 13b; block selection signal generators 14a and 14b; and block control circuits 15a and 15b. Each memory block 11a or 11b can be a separate memory array or bank having associated circuits such as block control circuit 15a or 15b that operate independently of the other memory blocks 11b or 11a.

When a memory cell in normal memory section 11a1 or 11b1 is defective, the defective memory cell can be replaced only by a redundant memory cell in the redundant memory section 11a2 or 11b2 included in the same memory block 11a or 11b. For example, when a memory cell M in the normal memory section 11a1 is defective, a row of memory cells including a wordline WL connected to the defective memory cell M can be replaced only by a row of redundant memory cells in the redundant memory section 11a2. When a memory cell in the normal memory section 11b1 is defective, the wordline connected to the defective memory cell, that is, a defective wordline in the normal memory section 11b1, can be replaced only by a redundant wordline in the redundant memory section 11b2.

Accordingly in the device of FIG. 1, when the number of defective wordlines in a normal section is larger than the number of redundant wordlines in the associated redundant memory section, the memory device cannot be repaired. For example, if the number of defective wordlines in the normal memory section 11a1 is larger than the number of redundant wordlines in the redundant memory section 11a2, the redundant wordlines cannot replace all of the defective wordlines even though the other redundant memory sections, for example, the redundant memory section 11b2, may contain available redundant wordlines. Such devices are unrepairable and must be discarded, which reduces manufacturing yield of operable memory devices.

SUMMARY OF THE INVENTION

To solve the above problem, the present invention provides a semiconductor device having a row redundancy scheme capable or promoting redundancy efficiency. In particular, a redundancy scheme in accordance with an embodiment of the invention uses redundant memory cells or row lines in one memory block (e.g., array or bank) to replace defective memory cells in another memory block (e.g., another array or bank).

According to one embodiment of the present invention, a semiconductor device includes means for replacing some defective wordlines in a normal memory section included in one memory block with redundant wordlines in a redundant memory section included in the memory block and replacing any remaining defective wordlines with redundant wordlines in a redundant memory section included in another memory block.

In an exemplary embodiment, the means comprises a plurality of redundant selection circuits, a plurality of block selection signal generators, a plurality of row decoders, and a control circuit.

Each redundant selection circuit can store a repair address corresponding to a defective wordline in any normal memory section, and each redundant selection circuit activates a redundancy signal for selecting a redundant wordline in a corresponding redundant memory section when an input address coincides with the stored repair address. The block selection signal generator activates the corresponding block selection signals in response to the most significant bits of the input address when the redundancy signals are deactivated, and each block selection signal generator activates the corresponding block selection signal regardless of the most significant address bits when a corresponding one of the redundancy signals is activated.

The row decoders select normal wordlines of a corresponding normal memory section in response to the input address when the redundancy signals are deactivated. The row decoders are disabled when one of the redundancy signals is activated.

The control circuit is commonly connected to the block selection signal generators and the row decoders and controls the block selection signal generators and the row decoders in response to a precharge signal and/or the redundancy signals.

According to another embodiment of the present invention, a semiconductor device includes memory blocks, redundant selection circuits, block selection signal generators, row decoders, and a control circuit. A defective wordline in a normal memory section of one of the memory blocks is replaced by a redundant wordline in a redundant memory section in a memory block other than the memory block containing the defective wordline.

Each of the memory blocks includes a normal memory section and a redundant memory section and is selected in response to a corresponding block selection signal. The redundant selection circuits generate a redundancy signal for selecting a redundant wordline in a corresponding redundant memory section when an input address coincides with a repair address stored therein.

The block selection signal generators generate corresponding block selection signals in response to the most significant bits of the input address, a control signal, and a corresponding redundancy signal. The row decoders are controlled by the control signal and select normal wordlines of a corresponding normal memory section in response to the input address. The control circuit generates the control signal in response to a precharge signal and the redundancy signals.

Therefore, in a semiconductor device having a row redundancy scheme according to the present invention, the defective wordlines can be replaced even when the number of defective wordlines in a normal memory section is larger than the number of redundant wordlines in a redundant memory section in the same memory block. Accordingly, the redundancy efficiency is significantly improved.

BRIEF DESCRIPTION OF THE DRAWINGS

The features and advantages of the present invention will become more apparent by describing in detail an exemplary embodiment thereof with reference to the attached drawings in which.

Use of the same reference symbols in the different figures indicates similar or identical elements.

DESCRIPTION OF THE PREFERRED EMBODIMENTS

Figure 1:
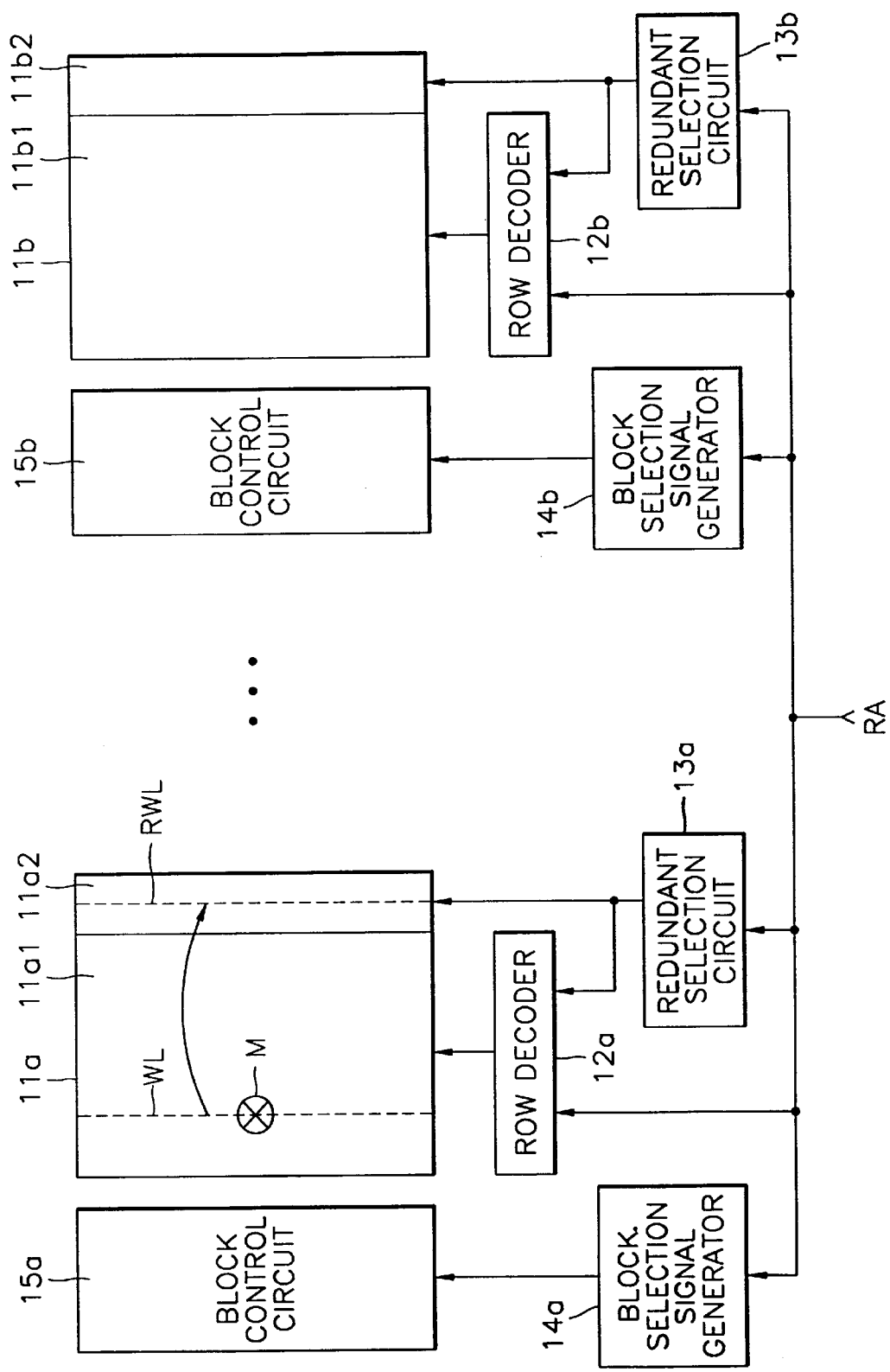
FIG. 1 is a block diagram of a semiconductor device having a conventional row redundancy scheme.
Figure 2:
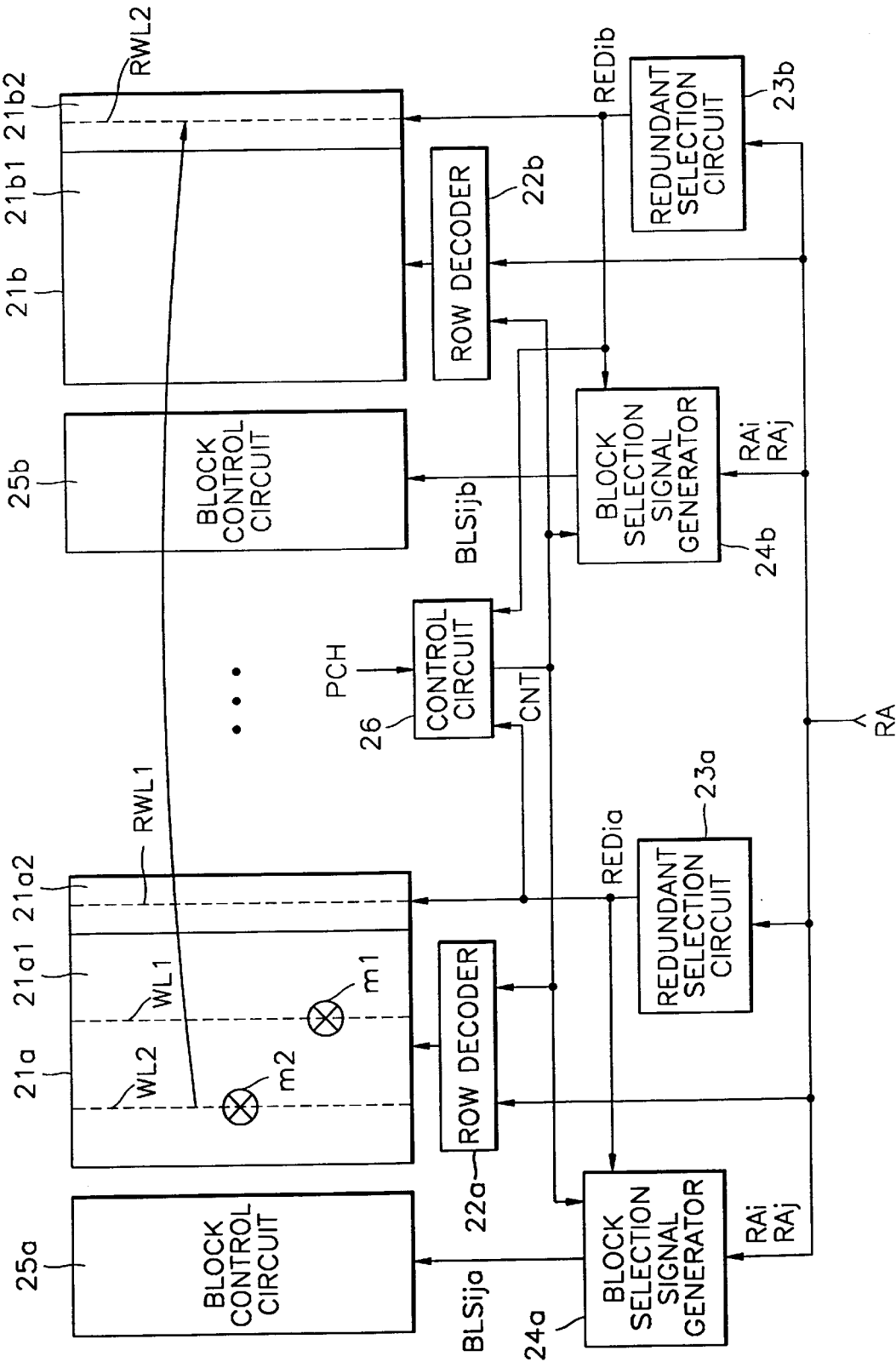
FIG. 2 is a block diagram of a semiconductor device having a row redundancy scheme according to the present invention.

In accordance with an aspect of the present invention, a redundant wordline in one memory block in a semiconductor memory device can replace a defective wordline in another memory block in the semiconductor memory device. FIG. 2 is a block diagram of a semiconductor memory device having a row redundancy scheme according to an embodiment of the present invention. In FIG. 2, the semiconductor memory device includes multiple memory blocks 21a and 21b. Each of the memory blocks 21a and 21b can be separate memory array or bank and includes a normal memory section containing normal memory cells and a redundant memory section containing redundant memory cells. In particular, the memory block 21a includes the normal memory cells are used when the semiconductor device operates normally. The redundant memory cells replace defective memory cells when some of the normal memory cells are defective.

The memory cells blocks 21a and 21b have respective row decoders 22a and 22b, redundant selection circuits 23a and 23b, block selection signal generators 24a and 2b, and block control circuits 25a and 25b. The row decoders 22a and 22b and block control circuits 25a and 25b can be conventional according to the type of memory (e.g., DRAM or SDRAM) and implement access to the respective memory blocks 21a and 21b. In particular, block control circuit 25a may include, for example, sense amplifiers for reading from block 21b. For a memory access such as a read or write operation, the row decoders 22a and 22b control selection of a normal wordline in respective normal memory sections 21a1 and 21b1. The redundant selection memory sections 21a2 and 21b2. The block control circuit 25a activates a block selection signal BLSija to select the memory block 21a for an access. The block control circuit 25b activates a block selection signal BLSijb to select the memory block 21b for an access.

A control circuit 26 controls block selection signal generators and row decoders corresponding to memory blocks that share redundancy resources. FIG. 2 shows a case where all memory block 21a and 21b share redundancy resources. Accordingly, an output signal CNT of the control circuit 26 is commonly connected to the row decoders 22a and 22b and the block selection signal generators 24a and 24b. However, the number of memory blocks that share the redundancy resources may vary in different embodiments of the invention.

The control circuit 26 precharges the signal CNT to a logic "high" level in response to a precharge signal PCH. The precharge signal can be activate, for example, in an SDRAM according to the timing of a read or write operation. When redundant selection circuits 23a and 23b deactivate redundancy signals REDia and REDib, the control circuit 26 maintains the precharged state of the output signal CNT. When either the redundancy REDia or the redundancy signal REDib is activated, the control circuit 26 discharges the output signal CNT to a logic "low" level. Here, the redundancy REDia is for selecting a redundant wordline in the redundant memory section 21a2, for example, redundant word line RWL1. The redundancy signal REDib is for selecting a redundant wordline in the redundant memory section 21b2, for example, redundant word line RWL2.

The block selection signal generators 24a and 24b generate respective block selection signals BLSija and BLSijb according to the signal CNT from the control circuit 26 and the respective redundancy signals REDia and REDib. Namely, the control signal CNT and the redundancy signal REDia control the block selection signal generator 24a. The control signal CNT and the redundancy signal REDib control the block selection signal generator 24b.

To be more specific, when the signal CNT of the control circuit 26 remains precharged, namely, when the redundancy signals REDia and REDib are deactivated, the block selection signal generator 24a activates the block selection signal BLSija in response to the most significant bits RAi and RAj of an input row address RA. The block selection signal generator 24b similarly activates the block selection signal BLSijb in response to the most significant bits RAi and RAj when the signal CNT of the control circuit 26 remains precharged. Accordingly, the most significant bits RAi and RAj of the input address signal select a memory block 21a or 21b for an access when the input address signal corresponds to a normal wordline that is not defective.

When the redundancy signals REDia and REDib are deactivated and the most significant bits RAi and RAj correspond to the memory block 21a, the block selection BLSija is activated. Accordingly, the block control circuit 25a and the row decoder 22a control an access of the normal memory section 21a1 in the memory block 21a. Also, when the most significant bits RAi and RAj correspond to the sub memory cell block 21b, the block selection signal generator 24b activates the block selection signal BLSijb. Accordingly, the block control circuit 25b and row decoder 22b control an access of the normal memory section 21a1 in the sub memory cell block 21b.

When the redundancy signal REDia is activated, the control circuit 26 discharges the signal CNT, and the block selection signal generator 24a activates the block selection signal BLSija regardless of the most significant bits RAi and RAj of the input row address RA. The block selection signal generator 24b deactivates the block selection signal BLSijb regardless of the most significant bits RAi and RAj. Accordingly, the block control circuit 25a and the redundant selection circuit 23 a select the redundant memory section 21a2 in the memory block 21a.

When the redundancy signal REDib is activated, the control circuit 26 discharges the signal CNT, and the block selection signal generator 24b activates the block selection signal BLSijb regardless of the most significant bits RAi and RAj of the input row address RA. The block selection signal generator 24a deactivates the block selection signal BLSija regardless of the most significant bits RAi and RAj. Accordingly, the block control circuit 25b and the redundant selection circuit 23b select the redundant memory section 21b2 of the memory block 21b.

The signal CNT from the control circuit 26 also controls the row decoders 22a and 22b. When the output signal CNT of the control circuit 26 remains precharged, namely, when the redundancy signals REDia and REDib are deactivated, each of the row decoders 22a and 22b decodes the input row address RA and selects the wordlines of the corresponding normal memory section. To be more specific, the row decoder 22a receives and decodes the input row address RA and selects a wordline in the normal memory section 21a1. Also, the row decoder 22b receives and decodes the input row address RA and selects a wordline in the normal memory section 21b1.

When the signal CNT from the control circuit 26 is discharged, namely, when either the redundancy signal REDia or the redundancy signal REDib is activated, the row decoders 22a and 22b are disabled. When the redundancy signal REDia is activated, a redundant wordline in the redundant memory section 21a2, for example, RWL1 is selected. When the redundancy signal REDib is activated, a redundant wordline in the redundant memory section 21b2, for example, wordline RWL2 is selected.

The redundant selection circuits 23a and 23b are general circuits containing non-volatile storage for row addresses of selective memory cells. In particular, for each redundant wordline in a redundant memory section 21a2 or 21b2, the corresponding redundant selection circuit 23a or 23b contains sufficient storage for a repair address that identifies both the block containing a defective memory cell and the wordline connected to the defective memory cell. When one or more memory cells in the normal memory sections 21a1 or 21b1 are defective, row addresses (repair addresses) corresponding to wordlines connected to the defective cell, that is, defective wordlines, are stored in the redundant selection circuits 23a or 23b. In one embodiment of the invention, the redundant selection circuits 23a and 23b, which generate the redundancy signals REDia and REDib, are referred to as redundant fuse boxes and include fuses which a laser can cut. In this embodiment, cutting fuses in a step of manufacturing the semiconductor device stores the row address of the defective wordlines in redundant selection circuit 23a or 23b.

In an embodiment of the present invention that is selected for convenience of explanation, each redundant memory section 21a2 and 21b2 contains only a single redundant wordline. In this embodiment, if two memory cells m1 and m2 in the normal memory section 21a1 are defective, the repair address corresponding to the wordline WL1 connected to the defective memory cell m1 can be stored in the redundant selection circuit 23a, and the repair address corresponding to the wordline WL2 connected to the defective memory cell m2 can be stored in the redundant selection circuit 23b, in order to replace the defective memory cells m1 and m2.

In this case, the redundant selection circuit 23a activates the redundancy signal REDia when the input row address RA coincides with the repair address stored therein, that is, the address corresponding to the defective wordline WL1. Accordingly, the redundant wordline RWL1 replaces the defective wordline WL1. Also, the redundant selection circuit 23b activates the redundancy signal REDib when the input row address RA coincides with the repair address stored therein, that is, the address corresponding to the defective wordline WL2. Accordingly, the redundant wordline RWL2 replaces the defective wordline WL2.

In this example, the repair address corresponding to the defective wordline WL1 is in the redundant selection circuit 23a, and the repair address corresponding to the defective wordline WL2 is in the redundant selection circuit 23b. However, an alternative repair operation stores the repair address corresponding to the defective wordline WL2 in the redundant selection circuit 23a and the repair address corresponding to the defective wordline WL1 in the redundant selection circuit 23b.

Hereinafter, the operation of the semiconductor device having a row redundancy scheme according to the present invention will be further described. For the convenience of explanation, the description is mostly limited to the case where the redundant resources of each of the redundant memory sections 21a2 and 21b2 contains only one redundant wordline. However, alternative embodiments of the invention include semiconductor memory devices having two or more redundant wordlines in each redundant memory section.

As described above, when the two memory cells m1 and m2 in the normal memory section 21a1 are defective, a manufacturing step stores the repair address corresponding to the wordline WL1 in the redundant selection circuit 23a and the repair address corresponding to the wordline WL2 in the redundant selection circuit 23b, in order to repair the defective memory cells m1 and m2.

When the input row address RA that is input from the outside through a predetermined path corresponds to a normal wordline that is not defective, the redundant selection circuits 23a and 23b deactivate the redundancy signals REDia and REDib. Accordingly, the control circuit 26 keeps the signal CNT precharged.

Therefore, if the row address corresponds to a normal wordline in normal memory section 21a1, the block selection signal generator 24a activates the block selection signal BLSija in response to the most significant bits RAi and RAj of the input row address RA and selects the memory block 21a, that is to say, the normal memory section 21a1. Also, the row decoder 22a receives and decodes the input row address RA and selects the normal wordline of the normal memory section 21a1.

After the above process selects the normal wordline, data is written into or read from the memory cells connected to the selected normal wordline.

When the input row address RA corresponds to the defective wordline WL1 of the normal memory section 21a1, the redundant selection circuit 23a activates the redundancy signal REDia, and the redundant selection circuit 23b deactivates the redundancy signal REDib. Accordingly, the control circuit 26 discharges the signal CNT.

Therefore, the block selection signal generator 24a activates the block selection signal BLSija regardless of the most significant bits RAi and RAj and selects the memory block 21a, that is to say, the redundant memory section 21a2. The row decoder 22a is disabled. At this time, the activated redundancy signal REDia selects the redundant wordline RWL1 of the redundant memory section 21a2. The redundant wordline RWL1 of the redundant memory section 21a2 replaces the defective wordline WL1 of the normal memory section 21a1.

After the above processes selects the redundant wordline RWL1, which replaces the defective wordline WL1, data is written into or read from the memory cells connected to the redundant wordline RWL1.

When the input row address RA corresponds to the defective wordline WL2 of the normal memory section 21a1, the redundant selection circuit 23a deactivates the redundancy signal REDia, and the redundant selection circuit 23b activates the redundancy signal REDib. Accordingly, the control circuit 26 discharges the signal CNT.

In response to the signal CNT being discharged and the redundancy signal REDib being activated, the block selection signal generator 24b activates the block selection signal BLSijb regardless of the most significant bits RAi and RAj and selects the memory block 21b, that is to say, the redundant memory section 21b2. The row decoder 22b is disabled. At this time, the redundancy signal REDib being activated selects the redundant wordline RWL2 of the redundant memory section 21b2. As a result, the redundant wordline RWL2 of the redundant memory section 21b2 replaces the defective wordline WL2 of the normal memory section 21a1.

After the above process selects the redundant wordline RWL2, which replaces the defective wordline WL2, data is written into or read from the memory cells connected to the redundant wordline RWL2.

Figure 3:
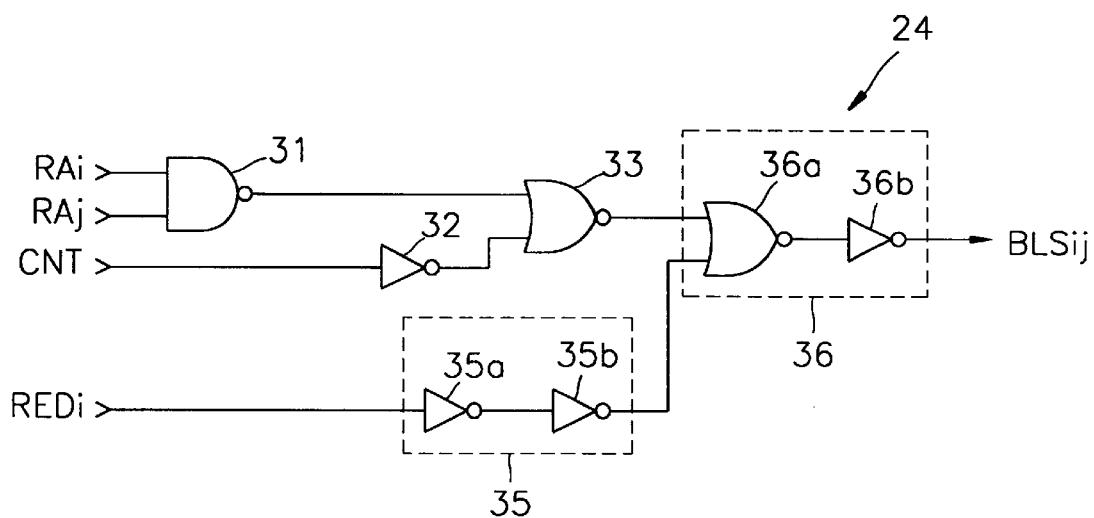
FIG. 3 is a circuit diagram showing an embodiment of the block selection signal generators shown in FIG. 2.

FIG. 3 is a circuit diagram showing an embodiment of a block selection signal generator 24 such as the block selection signal generators 24a and 24b shown in FIG. 2.

Referring to FIG. 3, the block selection signal generator 24 includes a NAND gate 31, an inverter 32, a NOR gate 33, a buffer 35, and an OR gate 36. The NAND gate 31 receives the most significant bits RAi and RAj of the input row address RA and performs a NAND operation. The output signal of NAND gate 31 goes to a logic low if address bits RAi and RAj correspond to the memory block associated with the block selection signal generator 24. In this embodiment, the block selection signal generator 24 corresponds to the fourth of a set of four memory blocks. Block selection signal generators for other memory blocks of the semiconductor memory device receive a combination of address bits RAi and RAj and the complements of address bits RAi and RAj. The received combination uniquely identifies the corresponding memory block. The inverter 32 inverts the signal CNT from the control circuit 26. The NOR gate 33 receives the output of the NAND gate 31 and the inverter 32 and performs a NOR operation. Accordingly, the output signal of the NOR gate is at a logic high level unless the signal CNT is discharged or the address bits RAi and RAj do not correspond to the memory block associated with the block selection signal generator. The buffer 35, which includes two inverters 35a and 35b, buffers the redundancy signal REDi. The OR gate 36, which includes a NOR gate 36a and an inverter 36b, receives the output signal of the NOR gate 33 and the output signal of the buffer 35, performs an OR operation, and outputs the block selection signal BLSij. Accordingly, the block selection signal generator asserts the signal BLSij (high) if the redundancy signal REDi is activated or if the signal CNT is precharged and the most significant address bits RAi and RAj correspond to the associated memory block.

Figure 4:
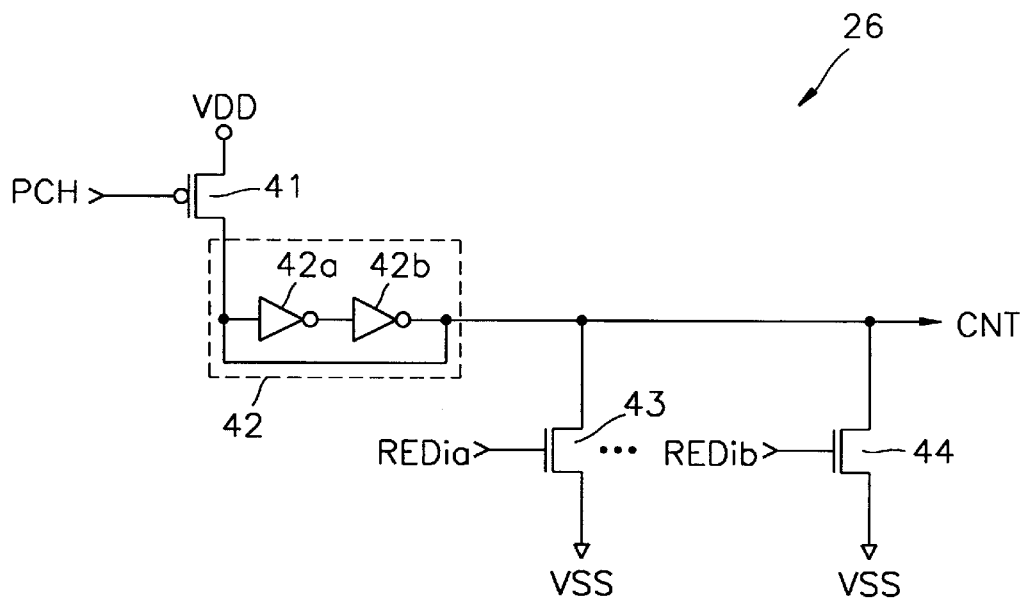
FIG. 4 is a circuit diagram showing an embodiment of the control circuit shown in FIG. 2.

Clearly, the block selection signal generator can have various structures in which other logic gates are used. No matter how the block selection signal generator is realized, the block selection signal generator should function as described above. FIG. 4 is a circuit diagram showing an embodiment of the control circuit 26 shown in FIG. 2. In FIG. 4, the control circuit 26 includes a PMOS pull up transistor 41, a state holder 42, and NMOS pull down transistors 43 and 44. The pull up transistor 42 pulls the output signal CNT up to the logic "high" level when the precharge signal PCH is at the logic "low" level. NMOS pull down transistors 43 and 44 discharge the signal CNT to the logic "low" level when any of the corresponding redundancy signals REDia and REDib are activated to the logic "high" level. The state holder 42, which includes two invertors 42a and 42b, holds the state of the signal CNT until the pull up transistor 41 or one of the pull down transistors 43 and 44 changes the state of the signal CNT.

It is apparent that the control circuit can have various structures in which other logic gates are used. No matter how the control circuit is realized, the function of the control circuit should function as described above.

As mentioned above, in the semiconductor device having the row redundancy scheme according to the present invention, it is possible to repair defective wordlines even if the number of defective wordlines in a particular memory block is larger than the number of redundant wordlines in the memory block. Namely, when the number of defective wordlines in the normal memory section is larger than the number of redundant wordlines in the associated redundant memory section, redundant wordlines in a redundant memory section included in another memory block can be used. Therefore, redundancy efficiency at repairing defects is greater than in a memory limited to replacing defective wordlines with redundant wordlines in the same block.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A semiconductor device, comprising:
   a plurality of memory blocks, each memory block comprising a normal memory section and a redundant memory section and being selected for access in response to activation of a corresponding selection signal; and
   means for replacing a defective wordline in a normal memory section included in a first of the memory blocks with a redundant wordline in the redundant memory section included in the first memory block and replacing a remaining defective wordline in the normal memory section of the first memory block with a redundant wordline in the redundant memory section included in a second of the memory blocks.

2. A semiconductor device comprising:
   a plurality of memory blocks, each memory block comprising a normal memory section and a redundant memory section and being selected for access in response to activation of a corresponding selection signal; and
   means for replacing a defective wordline in the normal memory section of a first memory block with a redundant wordline in the redundant memory section of a second memory block, the means comprising:
      a plurality of redundant selection circuits, wherein each redundant selection circuit contains storage for a repair address corresponding to a defective wordline in any of the normal memory sections and activates a redundancy signal for selecting a redundant wordline in a corresponding one of the redundant memory sections when an input address coincides with a stored repair address;
      a plurality of block selection signal generators, wherein each block selection signal generator activates a corresponding block selection signal in response to the most significant bits of the input address when the redundancy signals are deactivated and activates the corresponding block selection signal regardless of the most significant bits when a corresponding one of the redundancy signals is activated;

a plurality of row decoders, wherein each row decoder selects a normal wordline of a corresponding one of the normal memory sections in response to the input address when the redundancy signals are deactivated, the row decoders being disabled when one of the redundancy signals is activated; and a control circuit commonly connected to the block selection signal generators and the row decoders, for controlling the block selection signal generators and the row decoders in response to the redundancy signals.

3. The semiconductor device of claim 2, wherein each of the block selection signal generators comprises:

a NAND gate that receives signals indicating the most significant bits of the input address;

an inverter that inverts the output signal of the control circuit;

a NOR gate connected to the NAND gate and the inverter;

a buffer coupled to receive the corresponding redundancy signal; and an OR gate connected to receive signals from the NOR gate and the buffer, the OR gate outputting the corresponding block selection signal.

4. The semiconductor device of claim 2, wherein the control circuit comprises:

a pull up transistor connected to pull up the output signal of the control circuit in response to a precharge signal;

a plurality of pull down transistors connected to pull down the output signal in response to respective redundancy signals; and a state holder that holds a state of the output signal until the pull up transistor or the pull down transistors change the state of the output signal.

5. A semiconductor device, comprising:

a plurality of memory blocks, wherein each memory block comprises a normal memory section and a redundant memory section and is selected in response to a corresponding block selection signal;

a plurality of redundant selection circuits, wherein each redundant selection circuit generates a redundancy signal for selecting a redundant wordline in a corresponding redundant memory section when an input address coincides with a repair address stored in the redundant selection circuit;

a plurality of block selection signal generators, wherein each block selection signal generator is controlled by a control signal and a corresponding redundancy signal and generates a corresponding block selection signal in response to the most significant bits of the input address;

a plurality of row decoders controlled by the control signal, each row decoder selecting a normal wordline of a corresponding normal memory section in response to the input address; and a control circuit that generates the control signal in response to the redundancy signals, wherein a defective wordline in a normal memory section included in a first of the memory blocks is replaced by a redundant wordline in a redundant memory section included in a second of the memory blocks.

6. The semiconductor device of claim 5, wherein each of the block selection signal generators comprises:

a NAND gate that receives signals indicating the most significant bits of the input address;

an inverter that inverts the output signal of the control circuit;

a NOR gate connected to the NAND gate and the inverter;

a buffer coupled to receive the corresponding redundancy signal; and an OR gate connected to receive signals from the NOR gate and the buffer, the OR gate outputting the corresponding block selection signal.

7. The semiconductor device of claim 5, wherein the control circuit comprises:

a pull up transistor connected to pull up the output signal of the control circuit in response to a precharge signal;

a plurality of pull down transistors connected to pull down the output signal in response to respective redundancy signals; and a state holder that holds a state of the output signal until the pull up transistor or the pull down transistors change the state of the output signal.

8. The semiconductor device of claim 5, wherein the control circuit further responds to a precharge signal in generating the control signal.

9. A method of accessing memory comprising a plurality of memory blocks, each memory block comprising a normal memory section and a redundant memory section, said method comprising:

in response to activation of a selection signal, replacing a defective wordline in a normal memory section included in a first memory block with a redundant wordline in a redundant memory section included in the first memory block; and replacing a remaining defective wordline in the normal memory section of the first memory block with a redundant wordline in the redundant memory section included in a second memory block.

10. The method of claim 9, further comprising:

activating a redundancy signal for selecting a redundant wordline in a corresponding one of the redundant memory sections when an input address coincides with a repair address stored in one of a plurality of redundant selection circuits, wherein each redundant selection circuit contains storage for a repair address corresponding to a defective wordline in any of the normal memory sections;

activating a corresponding block selection signal in response to the most significant bits of the input address when the redundancy signals are deactivated;

activating the corresponding block selection signal regardless of the most significant bits when a corresponding one of the redundancy signals is activated;

selecting a normal wordline of a corresponding one of the normal memory sections in response to the input address when the redundancy signals are deactivated;

controlling the block selection signal generators and the row decoders in response to the redundancy signals.

* * * * *